(12) United States Patent
Yi

(10) Patent No.: US 7,198,998 B2  
(45) Date of Patent: Apr. 3, 2007

(54) METHOD OF MANUFACTURING BIPOLAR-COMPLEMENTARY METAL OXIDE SEMICONDUCTOR

(75) Inventor: Sang-don Yi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 285 days.

(21) Appl. No.: 10/944,156

(22) Filed: Sep. 17, 2004

(65) Prior Publication Data
US 2005/0090051 A1 Apr. 28, 2005

(30) Foreign Application Priority Data
Oct. 24, 2003 (KR) .................. 10-2003-0074672

(51) Int. Cl.
*H01L 21/8238* (2006.01)
(52) U.S. Cl. .................. 438/202; 438/235; 257/378; 257/370; 257/E27.015
(58) Field of Classification Search .......... 438/202, 438/235; 257/378, 370
See application file for complete search history.

(56) References Cited
U.S. PATENT DOCUMENTS

| | | | |
|---|---|---|---|
| 5,354,699 A * | 10/1994 | Ikeda et al. ............ | 438/234 |
| 5,665,616 A | 9/1997 | Kimura et al. .......... | 438/234 |
| 6,169,007 B1 | 1/2001 | Pinter .................. | 438/320 |
| 6,399,993 B1 * | 6/2002 | Ohnishi et al. ......... | 257/370 |
| 2002/0053737 A1 * | 5/2002 | Kondo et al. .......... | 257/758 |
| 2003/0020166 A1 * | 1/2003 | Kondo et al. .......... | 257/758 |
| 2003/0207512 A1 * | 11/2003 | Hsu .................... | 438/200 |
| 2005/0255649 A1 * | 11/2005 | Augusto et al. ........ | 438/235 |

FOREIGN PATENT DOCUMENTS

| JP | 9-107042 | 4/1997 |
|---|---|---|
| KR | 01-51482 | 6/2001 |
| KR | 10-2003-0015644 | 2/2003 |

* cited by examiner

*Primary Examiner*—Jerome Jackson
*Assistant Examiner*—Paul Budd
(74) *Attorney, Agent, or Firm*—Mills & Onello LLP (57) ABSTRACT

A method of manufacturing a bipolar-complementary metal oxide semiconductor (BiCMOS) is provided. A gate in a CMOS area and a conductive layer pattern defining an opening, which opens an active region in a bipolar transistor area, are simultaneously formed by patterning a gate conductive layer. Thereafter, bipolar transistor manufacturing processes are performed while CMOS manufacturing processes are performed. Accordingly, the number of masks is decreased, and degradation of device characteristics is prevented.

17 Claims, 6 Drawing Sheets

METHOD OF MANUFACTURING BIPOLAR-COMPLEMENTARY METAL OXIDE SEMICONDUCTOR

BACKGROUND OF THE INVENTION

This application claims the priority of Korean Patent Application No. 2003-74672, filed on Oct. 24, 2003, in the Korean Intellectual Property Office, the contents of which are incorporated herein in their entirety by reference.

1. Field of the Invention

The present invention, relates to a method of manufacturing a bipolar-complementary metal oxide semiconductor (BiCMOS) into which a bipolar transistor and a CMOS are integrated, and more particularly, to a method of manufacturing a BiCMOS using a heterojunction bipolar transistor (HBT) as a bipolar transistor.

2. Description of the Related Art

With the development of ultrahigh-speed communication technology, a high-frequency transistor has been developed rapidly. Recently, a SiGe HBT is used in a high-frequency transistor device. A SiGe HBT is different from a normal bipolar transistor in that a base is formed of a SiGe epitaxial layer. Since SiGe has a smaller energy band gap than Si, an HBT having a base formed of SiGe has improved current gain and operating speed. In addition, even when a concentration of a dopant in the base is increased, the current gain is not reduced, but base resistance is reduced. As a result, a noise figure of the device can be reduced. Moreover, since operating voltage is decreased, power consumption can be reduced. Meanwhile, a transition frequency ($f_T$) and a maximum oscillation frequency ($f_{MAX}$) can be increased by adjusting the content and the distribution of Ge in SiGe. Accordingly, a SiGe HBT is widely used as a high-frequency device having $f_T$ and $f_{MAX}$ of 50 GHz or higher for a communication device.

Such an HBT is integrated with a CMOS transistor, thereby forming a BiCMOS device. Usually, a BiCMOS has a structure in which a CMOS transistor is integrated with a bipolar transistor on a silicon substrate. In more advanced BiCMOS technology, a SiGe HBT instead of a bipolar transistor is used. A base made of SiGe is used for a high-performance HBT to process an analog signal, and a CMOS transistor is used to process a digital signal and store data.

Since such an SiGe HBT has the same performance as existing III-V compound semiconductors and can be subjected to silicon manufacturing processes, it can be manufactured at a low cost. In addition, since silicon semiconductor technology can be used, a system-on-chip (SOC) can be realized, thereby increasing applicability.

In conventional SiGe BiCMOS manufacturing processes in which existing SiGe HBT manufacturing processes are combined with existing CMOS transistor manufacturing processes, an HBT is formed after a CMOS transistor is formed, or HBT manufacturing processes are inserted in the middle of manufacturing a CMOS transistor. In such conventional methods of simply adding existing HBT manufacturing processes to existing CMOS transistor manufacturing processes, performance of a CMOS transistor may be degraded due to a different type of process added to the CMOS transistor manufacturing processes. For example, when an emitter dopant drive-in process is performed to manufacture an HBT after a source/drain of a CMOS transistor is formed, a profile of a source/drain junction is changed due to a thermal budget, thereby degrading performance of the CMOS transistor.

In addition, to perform photolithography to manufacture an HBT in a conventional method of adding existing HBT manufacturing processes to existing CMOS transistor manufacturing processes, 7 or 8 masks are additionally required. That is, the number of masks and the number of processes used in fabricating the device are increased.

SUMMARY OF THE INVENTION

The present invention provides a method of manufacturing a bipolar-complementary metal oxide semiconductor (BiCMOS), by which a CMOS transistor is integrated with a bipolar transistor without degrading performance of the CMOS transistor.

According to an aspect of the present invention, there is provided a method of manufacturing a BiCMOS. In the method, a CMOS area and a bipolar transistor area are defined on a substrate. A gate oxide layer and a gate conductive layer are sequentially formed on the substrate. A gate in the CMOS area and a conductive layer pattern defining an opening which opens an active region in the bipolar transistor area are simultaneously formed by patterning the gate conductive layer. Gate spacers on side walls of the gate and spacers on inner walls of the opening are simultaneously formed. A base conductive layer is formed on a resultant structure having the spacers. An insulating layer is formed on the base conductive layer. An emitter window is formed by etching the insulating layer. An emitter conductive layer is formed above the emitter window. An emitter is formed by patterning the emitter conductive layer and the insulating layer. A base is formed by patterning the base conductive layer. Source/drain regions are formed at opposite sides of the gate.

In one embodiment, the method further comprises implanting low-concentration ions after forming the gate so that the source/drain regions have a lightly doped drain (LDD) structure.

In one embodiment, the method further comprises implanting low-concentration ions after forming the gate spacers so that the source/drain regions have a lightly doped drain (LDD) structure.

In one embodiment, forming the base conductive layer comprises: exposing a surface of the substrate by removing the gate oxide layer in the opening; forming an undoped Si layer as a seed layer; and sequentially forming a SiGe layer and a doped SiGe layer on the Si layer.

In one embodiment, the spacers in the bipolar transistor area and the gate spacers are formed of a material selected from the group consisting of an oxide layer, a nitride layer, an oxynitride layer, and a polysilicon layer.

In one embodiment, the gate spacers and the spacers are formed of a polysilicon layer, the method further comprising implanting a dopant into the spacers in the bipolar transistor area so that the spacers in the bipolar transistor area become a doped polysilicon layer.

In one embodiment, the gate spacers and the spacers are formed of a polysilicon layer, the method further comprising diffusing a dopant in the base conductive layer so that the spacers in the bipolar transistor area become a doped polysilicon layer.

In one embodiment, the method further comprises re-oxidizing the gate before simultaneously forming the gate spacers and the spacers.

In one embodiment, forming the emitter comprises: patterning the emitter conductive layer so that a portion of the emitter conductive layer in the CMOS area is removed; and partially removing the insulating layer using a wet etching process so that a portion of the insulating layer between the patterned emitter conductive layer and the base conductive layer remains.

In one embodiment, forming the base comprises patterning the base conductive layer so that a portion of the base conductive layer in the CMOS area is removed.

In one embodiment, forming the source/drain regions comprises: performing high-concentration ion-implantation using the gate and the gate spacers as a mask; and performing drive-in of a high-concentration ion-implanted dopant using rapid thermal annealing (RTA). In this embodiment, drive-in of a dopant in the emitter is performed simultaneously with drive-in of the high-concentration ion-implanted dopant.

In one embodiment, the method further comprises forming an extrinsic base region by implanting ions into the bipolar transistor area while forming the source/drain regions.

In one embodiment, the method further comprises patterning the conductive layer pattern below the base after forming the base.

In one embodiment, the base is formed by merging the base conductive layer and the conductive layer pattern.

In another aspect, the invention is directed to another method of manufacturing a bipolar-complementary metal oxide semiconductor (BiCMOS). In accordance with the method, a CMOS area and a bipolar transistor area are defined on a substrate. A gate oxide layer is formed on the substrate, and a polysilicon gate layer is formed on the gate oxide layer. A gate in the CMOS area and a conductive layer pattern defining an opening which opens an active region in the bipolar transistor area are simultaneously formed by patterning the polysilicon gate layer. Gate spacers on side walls of the gate and spacers on inner walls of the opening are simultaneously formed. A SiGe base layer is formed on a resultant structure having the spacers. An insulating layer is formed on the SiGe base layer. An emitter window is formed by etching the insulating layer, and a polysilicon emitter layer is formed above the emitter window. An emitter is formed by patterning the polysilicon emitter layer and the insulating layer. A base is formed by patterning the SiGe base layer and the conductive layer pattern. Source/drain regions are formed at opposite sides of the gate by implanting ions into the opposite sides of the gate and performing drive-in of an ion-implanted dopant. Drive-in of a dopant in the emitter is performed during the drive-in of the ion-implanted dopant.

In one embodiment, the method further comprises forming an extrinsic base region by implanting ions into the bipolar transistor area while forming the source/drain regions.

In one embodiment, the base is formed by merging the SiGe base layer and the conductive layer pattern.

BRIEF DESCRIPTION OF THE DRAWINGS

The foregoing and other features and advantages of the invention will be apparent from the more particular description of an embodiment of the invention, as illustrated in the accompanying drawing. The drawing is not necessarily to scale, emphasis instead being placed upon illustrating the principles of the invention.

DETAILED DESCRIPTION OF THE INVENTION

The present invention will be described more fully hereinafter with reference to the accompanying drawings in which preferred embodiments of the invention are shown. In the drawings, the forms of elements are exaggerated for clarity.

FIGS. 1 through 8 are sectional views of stages in a method of manufacturing a bipolar-complementary metal oxide semiconductor (BiCMOS) according to a first embodiment of the present invention. In the first embodiment, a SiGe heterojunction bipolar transistor (HBT) is used as a bipolar transistor.

Figure 1:
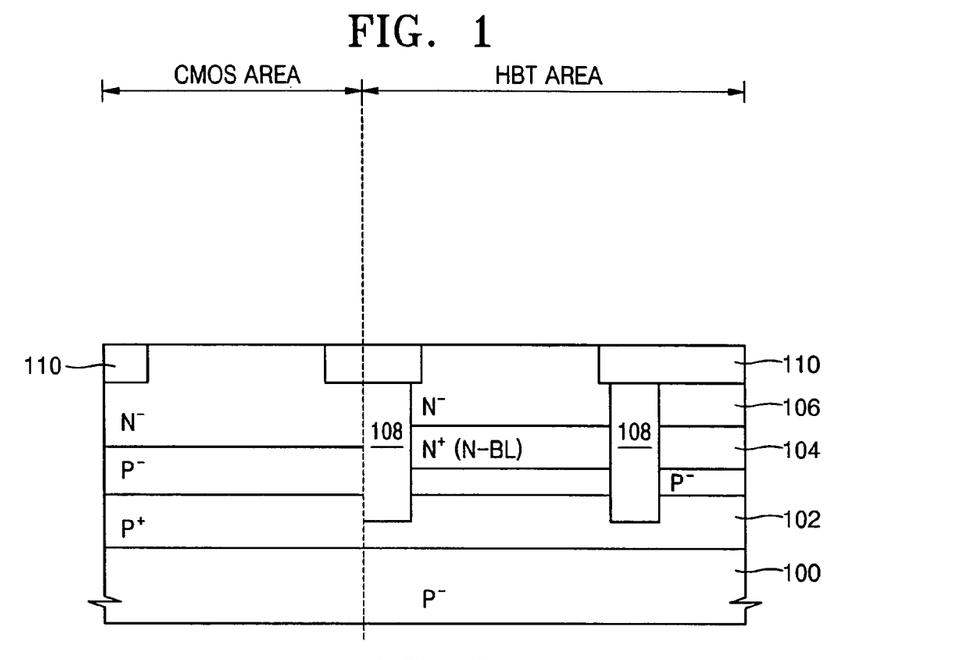
FIGS. 1 through 8 are sectional views of stages in a method of manufacturing a bipolar-complementary metal oxide semiconductor (BiCMOS) according to a first embodiment of the present invention.

Referring to FIG. 1, a semiconductor substrate 100, for example, a $P^-$ silicon substrate, having a $P^-$ dopant is prepared. An HBT area of the $P^-$ semiconductor substrate 100 is doped with an $N^+$ dopant such as As using a mask in which a predetermined portion is open, thereby forming a buried collector layer (N-BL) 104. Here, a CMOS area of the semiconductor substrate 100 may be doped with a $P^+$ dopant, thereby forming a $P^+$ region 102, or may be doped with an $N^+$ dopant while the buried collector layer 104 is formed, thereby forming an $N^+$ region. Atmospheric pressure chemical vapor deposition (APCVD) is performed on the semiconductor substrate 100 having the buried collector layer 104, thereby epitaxially growing a collector layer 106. Next, diffusion is performed so that the dopant in the buried collector layer 104 is diffused to the collector layer 106. As a result, the collector layer 106 becomes an $N^-$ epitaxial layer. The symbol "-" indicates a low concentration and generally denotes an order of $10^{16}/cm^3$. The symbol "+" indicates a high concentration and generally denotes an order of $10^{19}/cm^3$.

A device isolation layer, for example, including a poly silicon filled deep trench (PST) 108 and a shallow trench isolation 110, is formed on the semiconductor substrate 100 except for in an active region in the collector layer 106 using a widely known method. The PST 108 may be omitted. When the PST 108 is formed in the HBT area as shown in FIG. 1, the PST 108 may be formed while the STI 110 is formed. The PST 108 and the STI 110 electrically isolate adjacent transistors and define the CMOS area in which a CMOS is formed and the HBT area in which an HBT is formed. Next, the collector layer 106 may be doped with $N^+$ dopant ions using a mask having an opening in a portion where a collector electrode will be formed on the collector layer 106, thereby forming an $N^+$ subcollector contact (not shown).

Figure 2:
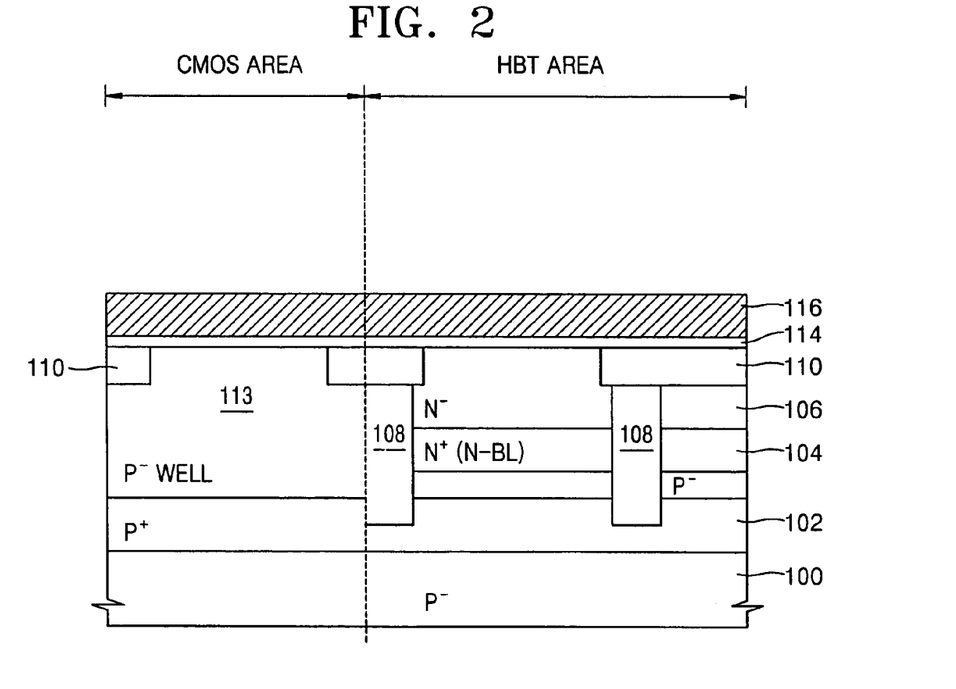

Referring to FIG. 2, an N well (not shown) and a P well 113 are formed in the CMOS area. When necessary, a capacitor (for example, a de-coupling capacitor) may be formed. As is well known, a CMOS transistor is integration of an N channel MOS transistor and a P channel MOS transistor. For clarity of the description, only an N channel MOS transistor is illustrated, but a P channel MOS transistor can be formed by using a conductivity type opposite to that used for the N channel MOS transistor, and a CMOS transistor can be formed by integrating the N channel MOS transistor and the P channel MOS transistor.

Next, a gate oxide layer 114 is formed on the entire surface of the semiconductor substrate 100. The gate oxide layer 114 may include a silicon oxide layer, a titanium oxide layer, an aluminum oxide layer, a hafnium oxide layer, a tantalum oxide layer, or the like formed through deposition. To form the gate oxide layer 114, typical deposition such as chemical vapor deposition (CVD), sub-atmospheric CVD (SACVD), low-pressure CVD (LPCVD), or plasma enhanced CVD (PECVD) may be used. Alternatively, a silicon oxide layer may be formed as the gate oxide layer 114 by thermally oxidizing the semiconductor substrate 100. Thereafter, a gate conductive layer 116, e.g., a doped polysilicon layer, is formed on the gate oxide layer 114. The doped polysilicon layer can be formed by performing LPCVD at a temperature of 500–700° C.

Figure 3:
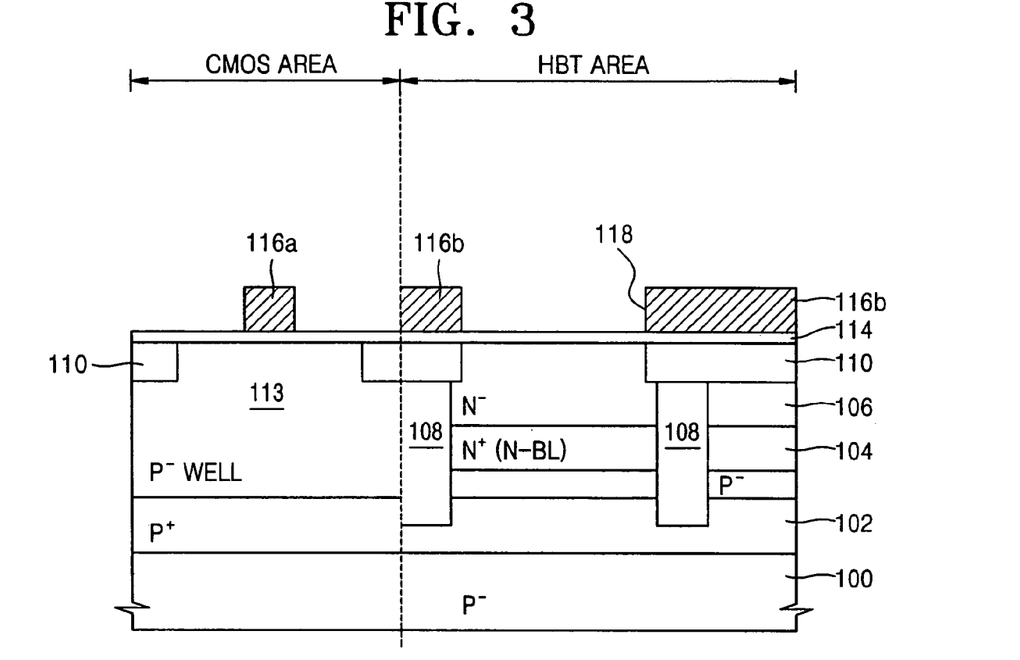

Referring to FIG. 3, the gate conductive layer 116 is patterned, thereby simultaneously forming a gate 116a in the CMOS area and a conductive layer pattern 116b in the HBT area. The conductive layer pattern 116b is formed to define an opening 118 that opens an active region in the HBT area.

Figure 4:
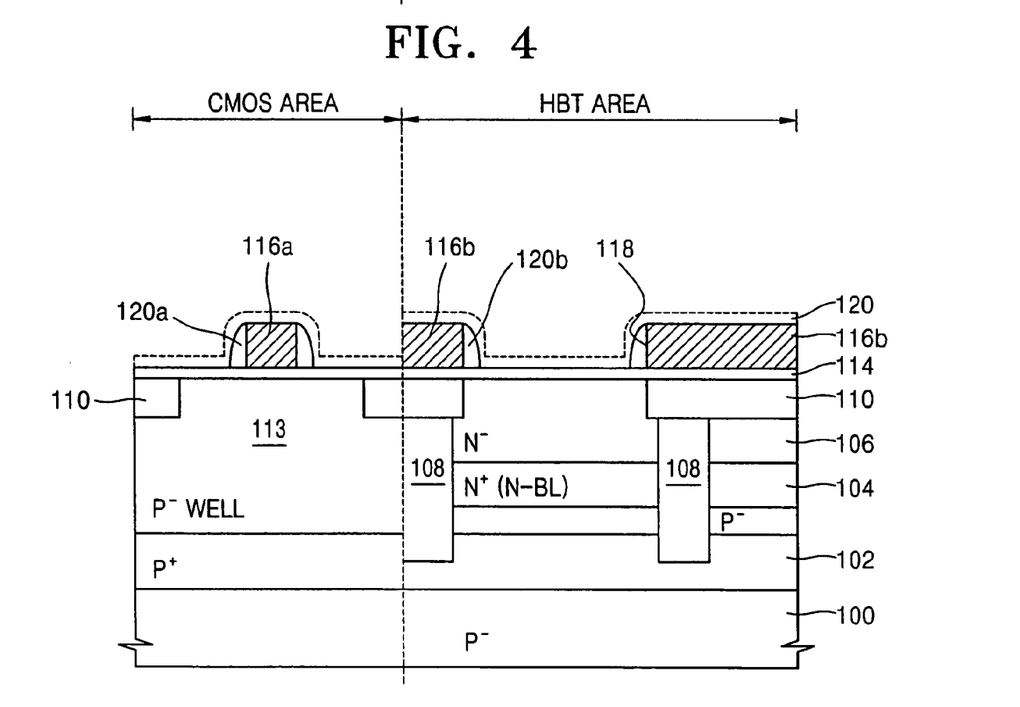

Next, referring to FIG. 4, an oxide layer, a nitride layer, or an oxynitride layer is thinly deposited on resultant structure including the gate 116a, thereby forming an insulating layer 120. The insulating layer 120 is etched back, thereby simultaneously forming gate spacers 120a on sidewalls of the gate 116a and spacers 120b on inner walls of the opening 118. The spacers 120b prevent a field recess in the HBT area. The gate spacers 120a and the spacers 120b may be formed of a polysilicon layer. After the gate spacers 120a and the spacers 120b are formed of a polysilicon layer, only the spacers 120b in the HBT area become doped polysilicon due to a dopant implanted into only the spacers 120b or diffused from a base conductive layer (not shown) to be formed above the spacers 120b in the HBT area. Such doped polysilicon spacers can be used as a base together with the base conductive layer to be formed in a subsequent process.

Figure 5:
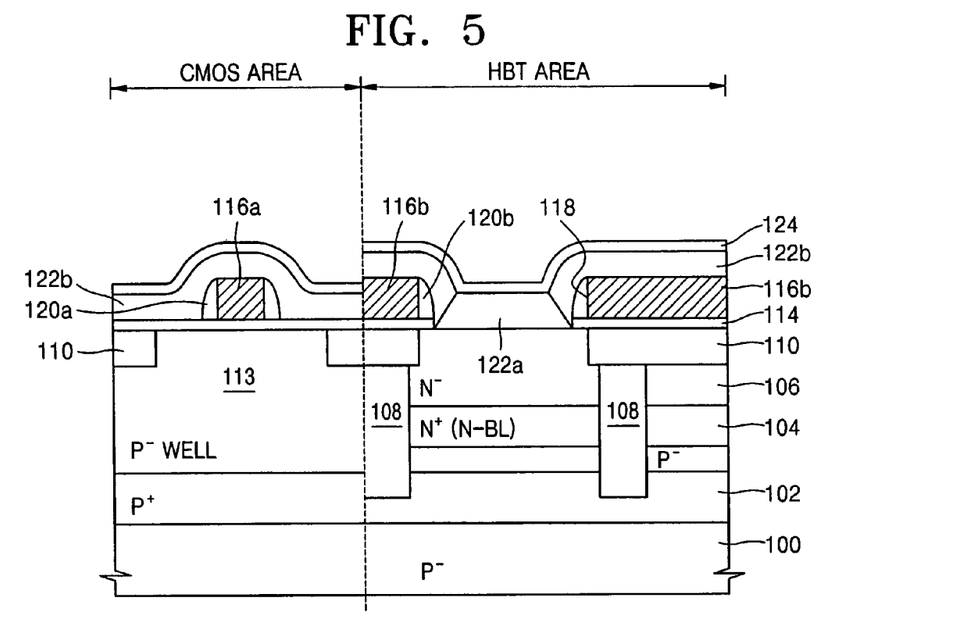

Next, referring to FIG. 5, base conductive layers 122a and 122b are formed on a resultant structure having the spacers 120b. Preferably, the base conductive layers 122a and 122b are made of SiGe. The gate oxide layer 114 in the opening 118 is removed, and then SiGe deposited on the entire surface of the semiconductor substrate 100. As a result, a SiGe epitaxial layer 122a is formed in the opening 118 while a poly SiGe layer 122b is formed elsewhere. When forming a SiGe layer, preferably, an undoped Si layer is formed as a seed layer, and then a SiGe layer and a doped SiGe layer are sequentially formed on the seed layer.

More specifically, the gate oxide layer 114 in the opening 118 in the HBT area is removed using wet cleaning. Wet cleaning can be performed using a hydrogen fluoride (HF) diluted solution or a buffered oxide etchant (BOE). Next, the SiGe epitaxial layer 122a is grown on the exposed surface of the semiconductor substrate 100. When growing the SiGe epitaxial layer 122a, two-dimensional planar doping may be performed a plurality of times in situ. Two-dimensional planar doping is a process of providing a doping source for a predetermined period of time when growing an epitaxial layer using a Si source and a Ge source. The SiGe epitaxial layer 122a should be formed to have only a small amount of carbon (C) and oxygen (O) at its interface and an exact doping concentration. SiGe deposited on polycrystals on the surface of the semiconductor substrate 100 except for the exposed portion, from which the gate oxide layer 114 is removed, forms a poly SiGe layer 122b. Next, an insulating layer 124, e.g., an oxide layer, is formed on the base conductive layers 122a and 122b to insulate an emitter from a base.

Figure 6:
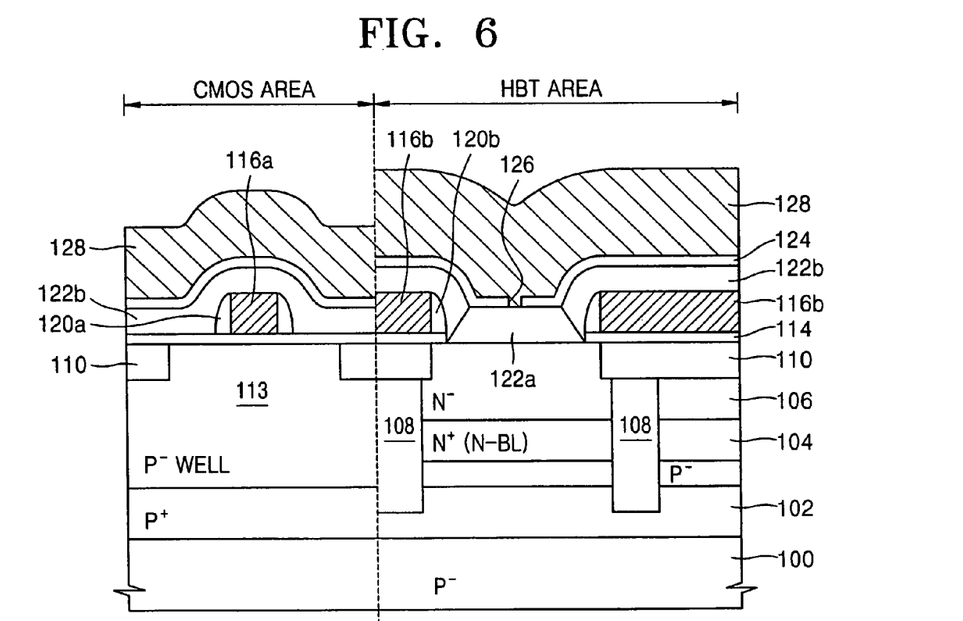

Referring to FIG. 6, the insulating layer 124 is etched, thereby opening an emitter window 126 for junction between an emitter and a base. In the stages described with reference to FIGS. 1 through 5, since HBT manufacturing processes are performed while CMOS manufacturing processes are performed, no additional masks are needed. In a stage illustrated in FIG. 6, a single additional mask is needed to open the emitter window 126. Next, an emitter conductive layer 128, e.g., a doped polysilicon layer, is formed on the entire surface of the semiconductor substrate 100 having the emitter window 126. For example, the emitter conductive layer 128 is formed using an in-situ method in which deposition of polysilicon and doping are simultaneously performed. When in-situ doped polysilicon cannot be deposited, ion-implantation may be performed on polysilicon to form doped polysilicon.

Figure 7:
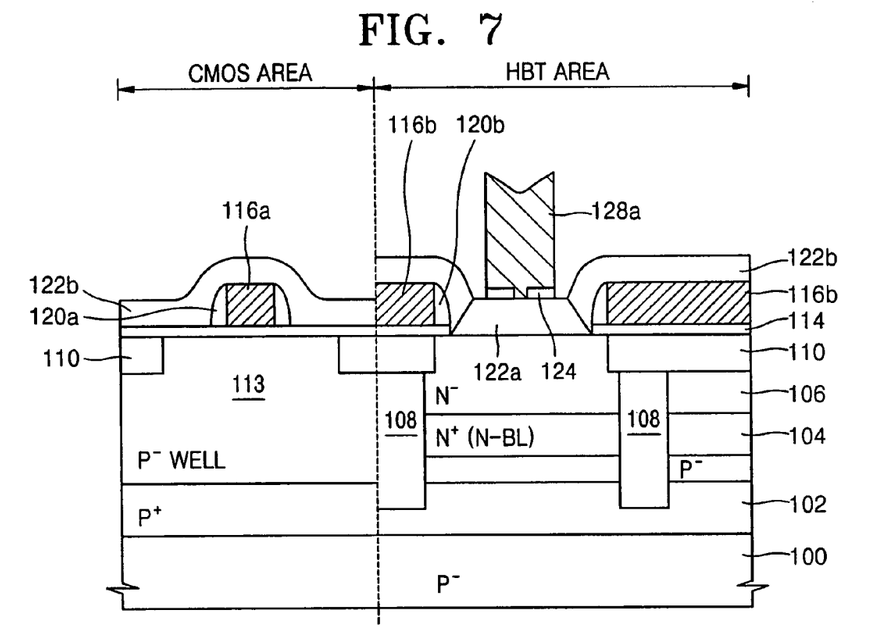

As shown in FIG. 7, the emitter conductive layer 128 is patterned in an emitter shape and is completely removed from the CMOS area, thereby forming an emitter 128a. Here, another additional mask is needed to pattern the emitter conductive layer 128. Next, the insulating layer 124 except for a portion between the emitter 128a and the base conductive layers 122a is removed using wet etching. When the removal of the insulating layer 124 and the patterning of the emitter conductive layer 128 are performed simultaneously, the emitter conductive layer 128 can be easily removed from the CMOS area without leaving a stringer of the insulating layer 124 by using a difference in a selectivity between oxide and polysilicon.

Figure 8:
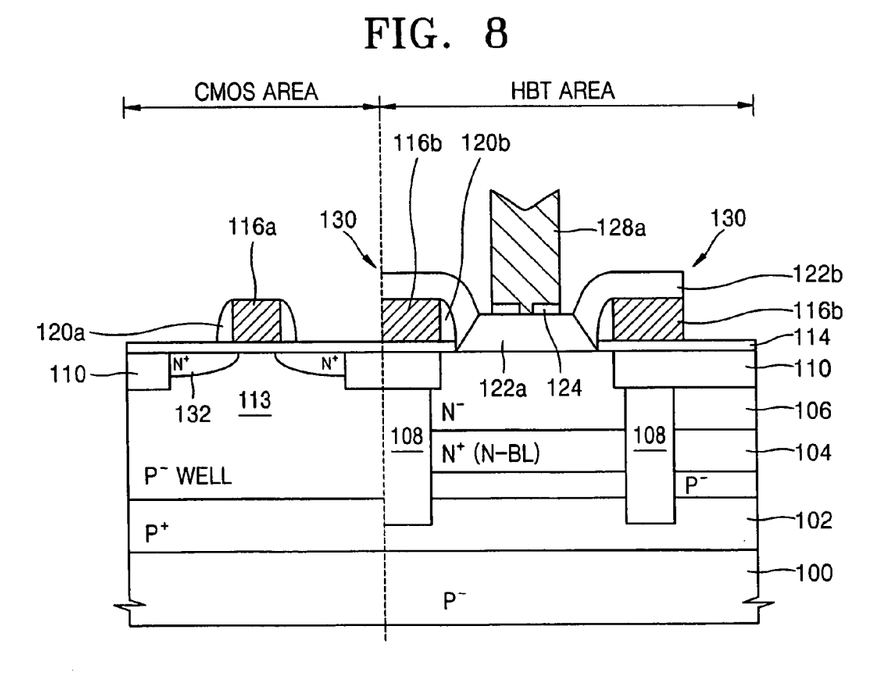

Referring to FIG. 8, the base conductive layers 122b is patterned, thereby forming a base 130. Here, an additional mask is needed to pattern the base conductive layers 122b. During the patterning, the base conductive layer 122b is completely removed from the CMOS area. Next, source/drain regions 132 are formed at opposite sides of the gate 116a. To form the source/drain regions 132, high-concentration ion-implantation is performed using the gate 116a and the gate spacers 120a as a mask. Next, drive-in of a high-concentration ion-implanted dopant is performed using rapid thermal annealing (RTA). At this time, drive-in of a dopant within the emitter 128a can be simultaneously performed. A thermal process for emitter drive-in conventionally causing a thermal budget can be integrated into a CMOS thermal process so that the conventional thermal budget can be reduced. Here, a substrate contact (not shown) may be formed using ion-implantation. After forming the base 130, the conductive layer pattern 116b below the base 130 may be patterned. In one embodiment of the present invention, the base conductive layer 122b and the conductive layer pattern 116b are merged into the base 130 so that low resistance can be implemented. In addition, as described above with reference to FIG. 4, when the spacers 120b are made of polysilicon, the spacers 120b become doped polysilicon due to drive-in of the dopant in the emitter 128a, thereby facilitating implementation of low resistance.

A self-align silicide process may be additionally performed at a contact when necessary. In this case, an ohmic contact is accomplished, thereby reducing contact resistance and parasitic base resistance.

As described above, only three masks are additionally needed in a method of manufacturing a BiCMOS according to embodiments of the present invention. As compared to conventional methods needing 7 or 8 additional masks, the number of necessary masks is remarkably reduced. A decrease in the number of masks, i.e., photolithographic processes, results in a decrease in manufacturing cost. In addition, since a thermal process for emitter drive-in conventionally causing a thermal budget can be integrated into a CMOS thermal process, the conventional thermal budget can be reduced.

Figure 9:
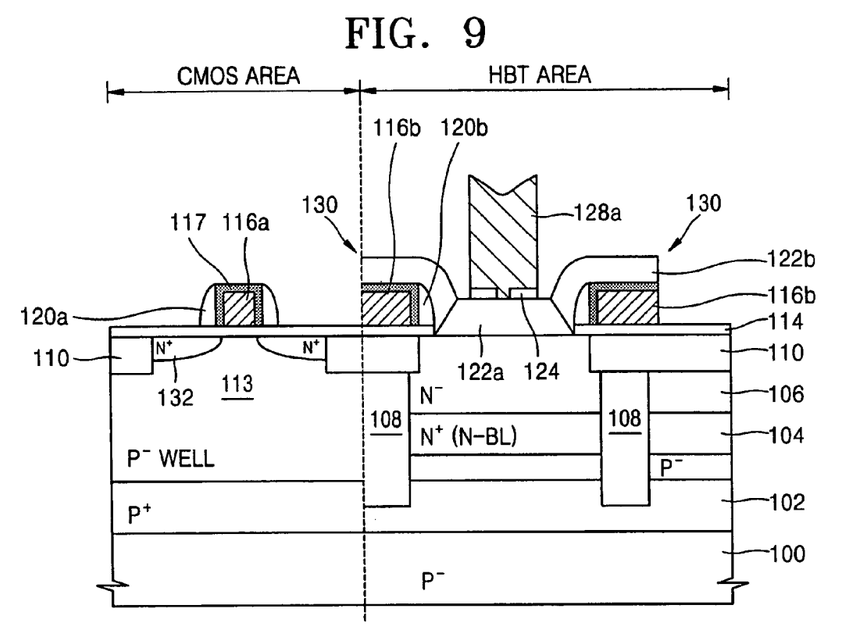
FIG. 9 is a sectional view illustrating a method of manufacturing a BiCMOS according to a second embodiment of the present invention.

FIG. 9 is a sectional view illustrating a method of manufacturing a BiCMOS according to a second embodiment of the present invention. After forming the gate 116a as in the first embodiment shown in FIG. 3, re-oxidation of the gate 116a may be performed before forming the spacers 120a shown in FIG. 4. If the re-oxidation is performed, a thermal oxide layer 117 is formed on exposed surfaces of conductive layers, i.e., the gate 116a and the conductive layer pattern 116b, so that damage and remnants produced in an etching process are removed, thereby improving reliability of the gate oxide layer 114. FIG. 9 shows a final resultant structure obtained when re-oxidation of the gate 116a is performed in manufacturing a BiCMOS. As shown in FIG. 9, the thermal oxide layer 117 is interposed between the gate 116a and the gate spacers 120a and between the conductive layer pattern 116b and the spacers 120b. As a result, the base conductive layer 122b is isolated from the conductive layer pattern 116b by the thermal oxide layer 117.

Figure 10:
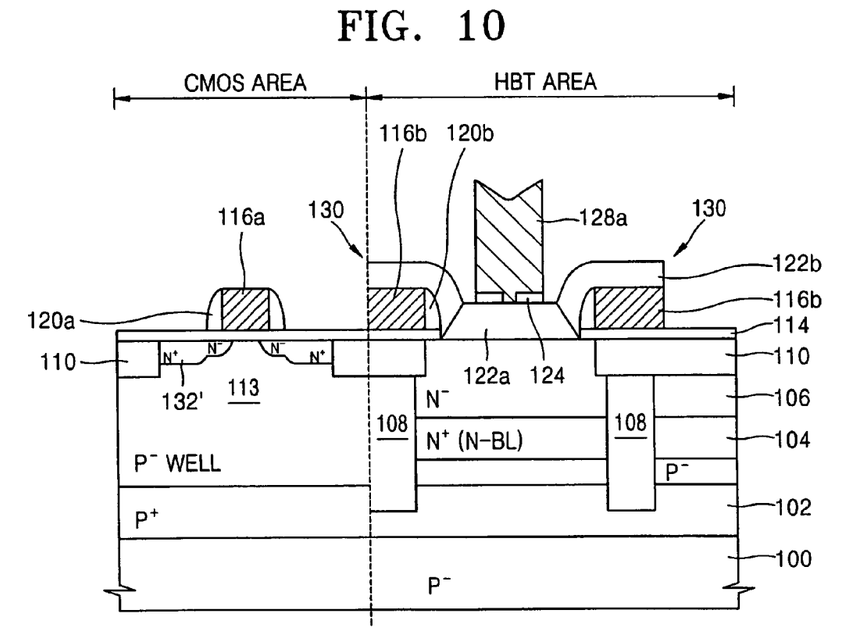
FIG. 10 is a sectional view illustrating a method of manufacturing a BiCMOS according to a third embodiment of the present invention.

FIG. 10 is a sectional view illustrating a method of manufacturing a BiCMOS according to a third embodiment of the present invention. After forming the gate 116a as in the first embodiment shown in FIG. 3, low-concentration ion-implantation is performed using the gate 116a as a mask to form a source/drain region 132' having a lightly doped drain (LDD) structure in the CMOS area. Alternatively, low-concentration ion-implantation may be performed after forming the gate spacers 120a as shown in FIG. 4. FIG. 10 shows a final resultant structure obtained when source/drain regions 132' having the LDD structure are formed by performing high-concentration ion-implantation after low-concentration ion-implantation in manufacturing a BiCMOS.

Figure 11:
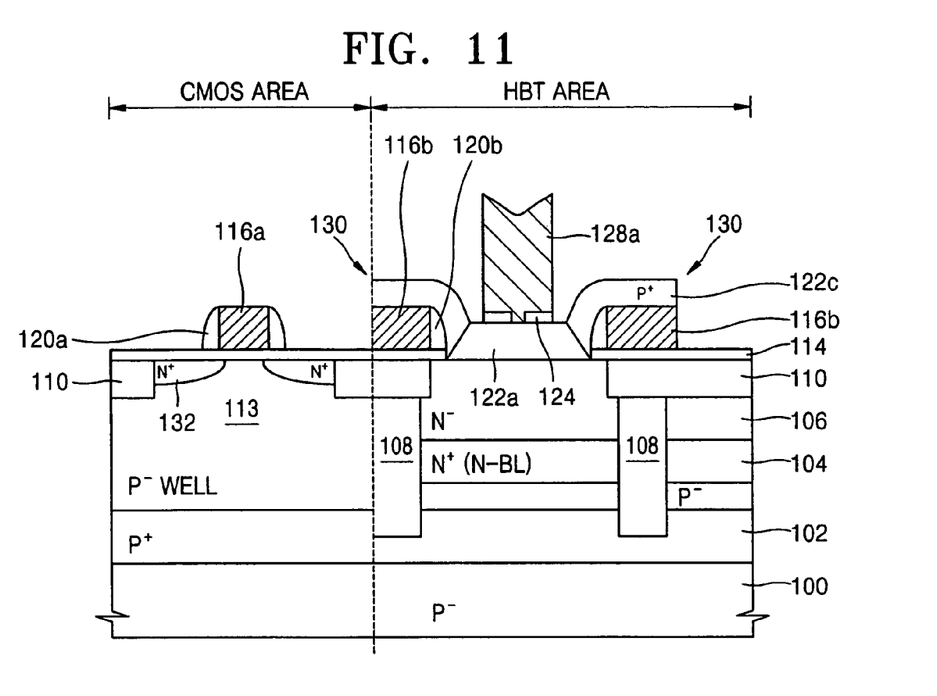
FIG. 11 is a sectional view illustrating a method of manufacturing a BiCMOS according to a fourth embodiment of the present invention.

FIG. 11 is a sectional view illustrating a method of manufacturing a BiCMOS according to a fourth embodiment of the present invention. While the source/drain regions 132 are formed as shown in FIG. 3 in the first embodiment, or while the source/drain regions 132' having the LDD structure are formed in the third embodiment, ion-implantation is performed in the HBT area, thereby forming a P$^+$ extrinsic base portion 122c. When the P$^+$ extrinsic base portion 122c is formed, a maximum oscillation frequency ($f_{MAX}$) can be increased or a noise figure can be improved.

As described above, according to the present invention, since a gate patterning process for a CMOS transistor is used to define an active region of an HBT transistor, a recess of a field region does not occur in an HBT area and low base resistance can be accomplished.

In the present invention, a BiCMOS can be manufactured using only three more masks for HBT manufacturing processes in addition to masks necessary for conventional CMOS manufacturing processes. The additional masks are used to open an emitter window, pattern an emitter conductive layer, and pattern a base conductive layer, respectively. Compared to conventional processes requiring 7 or 8 more masks in addition to masks necessary for conventional CMOS, the present invention can provide a high-performance SiGe BiCMOS at a low cost.

In addition, since HBT manufacturing processes are performed in the course of manufacturing a CMOS, a thermal budget can be minimized. For example, drive-in of a dopant within an emitter can be simultaneously performed during RTA for a source/drain region. As described above, since a thermal process for an HBT and a thermal process for a CMOS can be integrated, a thermal budget can be reduced. When thermal processes are integrated, out-diffusion of a dopant is minimized, and a high-performance bipolar transistor is integrated with a CMOS transistor without degrading the performance of the CMOS transistor. Accordingly, the present invention can allow a system-on-chip (SOC), into which a high-performance communication device and a high-performance digital processing device are integrated, to be implemented.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of manufacturing a bipolar-complementary metal oxide semiconductor (BiCMOS), comprising:
    defining a CMOS area and a bipolar transistor area on a substrate;
    forming a gate oxide layer on the substrate;
    forming a gate conductive layer on the gate oxide layer;
    simultaneously forming a gate in the CMOS area and a conductive layer pattern defining an opening which opens an active region in the bipolar transistor area by patterning the gate conductive layer;
    simultaneously forming gate spacers on side walls of the gate and spacers on inner walls of the opening;
    forming a base conductive layer on a resultant structure having the spacers;
    forming an insulating layer on the base conductive layer;
    forming an emitter window by etching the insulating layer;
    forming an emitter conductive layer above the emitter window;
    forming an emitter by patterning the emitter conductive layer and the insulating layer;
    forming a base by patterning the base conductive layer; and
    forming source/drain regions at opposite sides of the gate.

2. The method of claim 1, further comprising implanting low-concentration ions after forming the gate so that the source/drain regions have a lightly doped drain (LDD) structure.

3. The method of claim 1, further comprising implanting low-concentration ions after forming the gate spacers so that the source/drain regions have a lightly doped drain (LDD) structure.

4. The method of claim 1, wherein forming the base conductive layer comprises:
    exposing a surface of the substrate by removing the gate oxide layer in the opening;
    forming an undoped Si layer as a seed layer; and
    sequentially forming a SiGe layer and a doped SiGe layer on the Si layer.

5. The method of claim 1, wherein the spacers in the bipolar transistor area and the gate spacers are formed of a material selected from the group consisting of an oxide layer, a nitride layer, an oxynitride layer, and a polysilicon layer.

6. The method of claim 1, wherein the gate spacers and the spacers are formed of a polysilicon layer, the method further comprising implanting a dopant into the spacers in the bipolar transistor area so that the spacers in the bipolar transistor area become a doped polysilicon layer.

7. The method of claim 1, wherein the gate spacers and the spacers are formed of a polysilicon layer, the method further comprising diffusing a dopant in the base conductive layer so that the spacers in the bipolar transistor area become a doped polysilicon layer.

8. The method of claim 1, further comprising re-oxidizing the gate before simultaneously forming the gate spacers and the spacers.

9. The method of claim 1, wherein forming the emitter comprises:
   patterning the emitter conductive layer so that a portion of the emitter conductive layer in the CMOS area is removed; and
   partially removing the insulating layer using a wet etching process so that a portion of the insulating layer between the patterned emitter conductive layer and the base conductive layer remains.

10. The method of claim 1, wherein forming the base comprises patterning the base conductive layer so that a portion of the base conductive layer in the CMOS area is removed.

11. The method of claim 1, wherein forming the source/drain regions comprises:
   performing high-concentration ion-implantation using the gate and the gate spacers as a mask; and
   performing drive-in of a high-concentration ion-implanted dopant using rapid thermal annealing (RTA),
   wherein drive-in of a dopant in the emitter is performed simultaneously with drive-in of the high-concentration ion-implanted dopant.

12. The method of claim 1, further comprising forming an extrinsic base region by implanting ions into the bipolar transistor area while forming the source/drain regions.

13. The method of claim 1, further comprising patterning the conductive layer pattern below the base after forming the base.

14. The method of claim 1, wherein the base is formed by merging the base conductive layer and the conductive layer pattern.

15. A method of manufacturing a bipolar-complementary metal oxide semiconductor (BiCMOS), comprising:
   defining a CMOS area and a bipolar transistor area on a substrate;
   forming a gate oxide layer on the substrate;
   forming a polysilicon gate layer on the gate oxide layer;
   simultaneously forming a gate in the CMOS area and a conductive layer pattern defining an opening which opens an active region in the bipolar transistor area by patterning the polysilicon gate layer;
   simultaneously forming gate spacers on side walls of the gate and spacers on inner walls of the opening;
   forming a SiGe base layer on a resultant structure having the spacers;
   forming an insulating layer on the SiGe base layer;
   forming an emitter window by etching the insulating layer;
   forming a polysilicon emitter layer above the emitter window;
   forming an emitter by patterning the polysilicon emitter layer and the insulating layer;
   forming a base by patterning the SiGe base layer and the conductive layer pattern; and
   forming source/drain regions at opposite sides of the gate by implanting ions into the opposite sides of the gate and performing drive-in of an ion-implanted dopant,
   wherein drive-in of a dopant in the emitter is performed during the drive-in of the ion-implanted dopant.

16. The method of claim 15, further comprising forming an extrinsic base region by implanting ions into the bipolar transistor area while forming the source/drain regions.

17. The method of claim 15, wherein the base is formed by merging the SiGe base layer and the conductive layer pattern.

* * * * *